US011913112B2

(12) United States Patent
Lei et al.

(10) Patent No.: US 11,913,112 B2
(45) Date of Patent: *Feb. 27, 2024

(54) PROCESSES FOR DEPOSITING SILICON-CONTAINING FILMS USING HALIDOSILANE COMPOUNDS AND COMPOSITIONS

(71) Applicant: VERSUM MATERIALS US, LLC, Tempe, AZ (US)

(72) Inventors: Xinjian Lei, Vista, CA (US); Jianheng Li, Santa Clara, CA (US); John Francis Lehmann, Bethlehem, PA (US); Alan Charles Cooper, Macungie, PA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/586,497

(22) Filed: Jan. 27, 2022

(65) Prior Publication Data

US 2022/0154331 A1   May 19, 2022

Related U.S. Application Data

(62) Division of application No. 15/735,832, filed as application No. PCT/US2016/037370 on Jun. 14, 2016, now Pat. No. 11,268,190.

(60) Provisional application No. 62/181,494, filed on Jun. 18, 2015, provisional application No. 62/180,382, filed on Jun. 16, 2015.

(51) Int. Cl.
| | |
|---|---|
| *C23C 16/34* | (2006.01) |
| *B01J 29/40* | (2006.01) |
| *C23C 16/02* | (2006.01) |
| *C23C 16/36* | (2006.01) |
| *C23C 16/44* | (2006.01) |
| *C23C 16/448* | (2006.01) |
| *C23C 16/455* | (2006.01) |

(52) U.S. Cl.
CPC ............ *C23C 16/345* (2013.01); *B01J 29/40* (2013.01); *C23C 16/0254* (2013.01); *C23C 16/36* (2013.01); *C23C 16/4404* (2013.01); *C23C 16/4488* (2013.01); *C23C 16/45536* (2013.01); *C23C 16/45553* (2013.01)

(58) Field of Classification Search
CPC ............ C23C 16/345; C23C 16/0254; C23C 16/45525; C23C 16/45553
See application file for complete search history.

(56) References Cited

U.S. PATENT DOCUMENTS

| | | | |
|---|---|---|---|
| 4,555,464 A | 11/1985 | Kido | |
| 6,313,035 B1 | 11/2001 | Sandhu | |
| 7,531,679 B2 * | 5/2009 | Wang | C07F 7/025 556/412 |
| 7,772,097 B2 * | 8/2010 | Tomasini | C23C 16/04 438/505 |
| 7,939,447 B2 * | 5/2011 | Bauer | H01L 21/02636 216/37 |
| 8,168,123 B2 | 5/2012 | Sanchez | |
| 8,206,676 B2 | 6/2012 | Agarwal et al. | |
| 8,298,628 B2 | 10/2012 | Yang | |
| 8,367,528 B2 * | 2/2013 | Bauer | H01L 21/02573 438/149 |
| 8,590,705 B2 | 11/2013 | Behm et al. | |
| 9,337,018 B2 | 5/2016 | Xiao | |
| 9,796,739 B2 | 10/2017 | Xiao | |
| 11,268,190 B2 * | 3/2022 | Lei | C23C 16/4404 |
| 2002/0119327 A1 | 8/2002 | Arkles | |
| 2005/0181633 A1 | 8/2005 | Hochberg | |
| 2006/0032443 A1 | 2/2006 | Hasebe et al. | |
| 2008/0026149 A1 * | 1/2008 | Tomasini | H01L 21/02576 118/728 |
| 2008/0099933 A1 | 5/2008 | Choi et al. | |
| 2009/0111246 A1 | 4/2009 | Bauer | |
| 2010/0304047 A1 | 12/2010 | Yang et al. | |
| 2011/0061733 A1 | 3/2011 | Hurley | |
| 2011/0115014 A1 | 5/2011 | Ichinose | |
| 2012/0171102 A1 | 7/2012 | Sanchez | |

(Continued)

FOREIGN PATENT DOCUMENTS

| | | |
|---|---|---|
| DE | 102007050573 | 4/2009 |
| EP | 2243745 | 10/2010 |

(Continued)

OTHER PUBLICATIONS

Murray, Ciaran A., et al., "The Effect of Reaction Mechanism on Precursor Exposure Time in Atomic Layer Deposition of Silicon Oxide and Silicon Nitride". Chemistry of Materials, ACS Applied Materials & Interfaces, 6 (2014) 10534-10541.*

Nakajima, Anri, et al., "Low-temperature formation of silicon nitride gate dielectrics by atomic-layer deposition". Applied Physics Letters, vol. 79, No. 5, Jul. 30, 2001, pp. 665-667.*

Knoops, Harm C.M., et al., "Atomic Layer Deposition of Silicon Nitride from Bis(tertbutylamino)silane and N2 Plasma". ACS Applied Materials & Interfaces, Jul. 2015, 19857-19862.*

Meng, Xin, et al., "Atomic Layer Deposition of Silicon Nitride Thin Films: A Review of Recent Progress, Challenges, and Outlooks". Materials, Sep. 2016, 1007, pp. 1-20.*

Lee, Won-Jun, et al., "A Comparative Study on the Si Precursors for the Atomic Layer Deposition of Silicon Nitride Thin Films". Journal of the Korean Physical Society, vol. 45, No. 5, Nov. 2004, pp. 1352-1355.*

(Continued)

*Primary Examiner* — Bret P Chen
(74) *Attorney, Agent, or Firm* — David K. Benson

(57) ABSTRACT

Processes for depositing silicon-containing films (e.g., silicon, amorphous silicon, silicon oxide, silicon nitride, silicon carbide, silicon oxynitride, silicon carbonitride, doped silicon films, and metal-doped silicon nitride films) are performed using halidosilane precursors. Examples of halidosilane precursor compounds described herein, include, but are not limited to, monochlorodisilane (MCDS), monobromodisilane (MBDS), monoiododisilane (MIDS), monochlorotrisilane (MCTS), and monobromotrisilane (MBTS), monoiodotrisilane (MITS).

5 Claims, 1 Drawing Sheet

(56) References Cited

U.S. PATENT DOCUMENTS

| | | |
|---|---|---|
| 2012/0212826 A1 | 8/2012 | Henn |
| 2013/0078392 A1* | 3/2013 | Xiao .................. C23C 16/402 |
| | | 546/14 |
| 2013/0323435 A1* | 12/2013 | Xiao ................ H01L 21/02126 |
| | | 546/14 |
| 2013/0334511 A1 | 12/2013 | Savas |
| 2014/0186975 A1 | 7/2014 | Butler |
| 2014/0273528 A1 | 9/2014 | Niskanen et al. |
| 2014/0273531 A1 | 9/2014 | Niskanen |
| 2015/0147484 A1 | 5/2015 | Nguyen et al. |
| 2015/0147871 A1* | 5/2015 | Xiao ................ H01L 21/02274 |
| | | 556/412 |
| 2015/0246937 A1* | 9/2015 | Xiao ..................... C07F 7/025 |
| | | 556/406 |
| 2015/0376211 A1* | 12/2015 | Girard .................. C23C 16/308 |
| | | 556/412 |
| 2016/0168169 A1* | 6/2016 | Xiao ..................... C07F 7/025 |
| | | 556/406 |
| 2016/0358767 A1 | 12/2016 | Nitta |
| 2017/0053792 A1* | 2/2017 | Lu ..................... C23C 16/45551 |
| 2017/0207082 A1 | 7/2017 | Wang |
| 2018/0066359 A1 | 3/2018 | Kim |
| 2018/0151344 A1 | 5/2018 | Niskanen |
| 2019/0333754 A1 | 10/2019 | Lee |
| 2019/0348271 A1 | 11/2019 | Yan |
| 2019/0376187 A1 | 12/2019 | Noda |
| 2020/0140995 A1 | 5/2020 | Blanquart |
| 2021/0222300 A1 | 7/2021 | Kim |

FOREIGN PATENT DOCUMENTS

| | | |
|---|---|---|
| JP | 2015097255 A2 | 5/2015 |
| KR | 20150036122 A | 4/2015 |
| WO | 2010/053878 | 5/2010 |

OTHER PUBLICATIONS

Tanaka, Masayuki, et al., "Film Properties of Low-k Silicon Nitride Films Formed by Hexachlorodisilane and Ammonia". Journal of The Electrochemical Society, 147(6) 2284-2289 (2000).*

Han, Jeong-Yong, et al., "Characteristics of ALD Silicon Nitride Grown with HCDS". Master's Dissertation, Department of Materials and Chemical Engineering Hanyang University Aug. 2014, pp. 1-48.*

Meng, Xin, et al. "Atomic Layer Deposition of Silicon Nitride Thin Films; A Review of Recent Progress, Challengs and Outlooks"; Review Article. Materials, Sep. 2016, 1007, pp. 1-20. DOI: 10.3390/MA9121007.

Liu, Xuejian, et al, "Chemical Vapor Deposition of Silicon Nitride Thin Films From TIRS (Diethylamino)Chlorosilane". Materials Letter 59 (2005) pp. 11-14.

Liu, Li-Hong, et al. "Surface Etching, Chemical Modification and Characterization of Silicon Nitride and Silicon Oxide—Selective Functionalization of SI3N4 and SIO2" Journal of Physics: Condensed Matter 28 (2016) 094014 pp. 1-20 DOI: 10.1088/0953-8984/28/9/094014.

Chae, Sujong, et al. "Gas Phase Synthesis of Amorphous Silicon Nitride Nanoparticles for High-Energy LIBS" Energy Environ. Sci., 2020, 13, 1212-1221.

Abedini, M. et al., "Preparation of disilanyl chloride and disilanyl bromide by the reaction of disilane with hydrogen halide" J. Inorg. Nucl. Chem., vol. 25, No. 3, 1963, pp. 307-309 XP002765380.

Bouyer et al., "Thermal Plasma Chemical Vapor Deposition of Si-Based Ceramic Coatings from Liquid Precursors" Plasma Chemistry and Plasma Processing, vol. 21, No. 4, Dec. 1, 2001, pp. 523-546, XP055301726, New York, DOI: 10.1023/A: 1012047001193 (retrieved from the Internet: URL:www.springer.com).

Hassler, K. et al., "Syntheses, infrared and Raman vibrational spectra, normal coordinate analyses and 29Si-NMR-Spectra of halogenated disilanes XnSi2H6-n (X=F, Ci, Br, I)" Journal of Molecular Structure, 348, Elsevier, Jan. 1, 1995, pp. 353-356, XP055330513, Retrieved from the internet URL: http://www.sciencedirect.com/science/article/pii/002228609508661E/pdf?md5=b4c27bbbd21c58e7ea3e9e446c027f8e&pid=1-s2.0-002228609508661E-main.pdf.

Hollandsworth and Ring, "Chlorodisilanes. Preparation and silicon-hydrogen stretching frequencies" Inorganic Chemistry, vol. 7, No. 8, Aug. 1, 1968, pp. 1635-1637, XP055330519, Easton, US, ISSN: 0020-1669, DOI: 10.1021/ic50066a033.

Drake, J. E. and Goddard, N. et al, "The formation and identification of chlorodisilanes and monochlorotrisilane" Inorg. Nucl. Chem. Lett., vol. 4 pp. 385-388 (1968).

International Search Report and Written Opinion for counterpart international patent application No. PCT/US2016/037370 dated Jan. 20, 2017 by the European Patent Office ("EPO") in its capacity as International Searching Authority ("ISA").

* cited by examiner

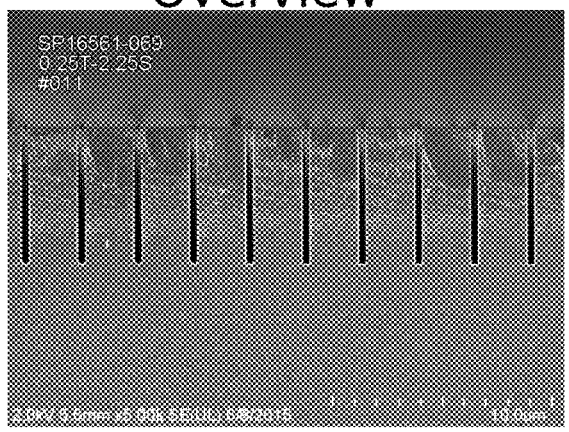
Overview
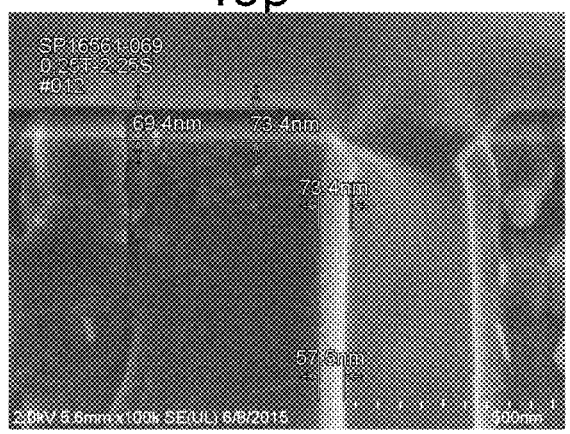
Top
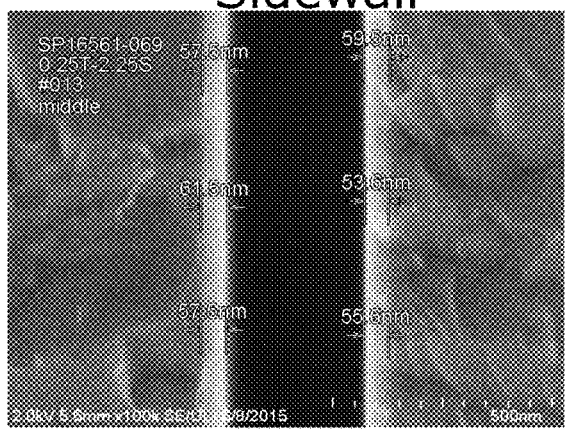
Sidewall
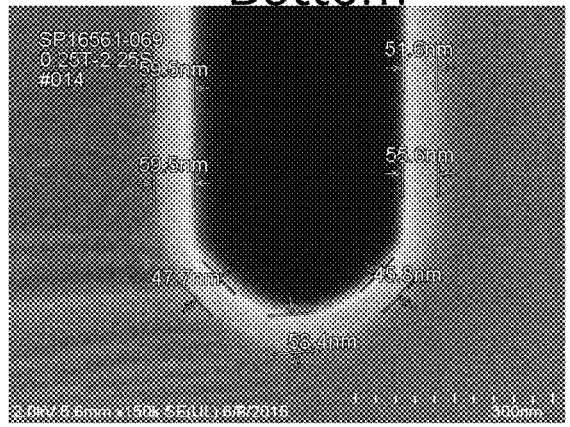
Bottom

PROCESSES FOR DEPOSITING SILICON-CONTAINING FILMS USING HALIDOSILANE COMPOUNDS AND COMPOSITIONS

CROSS REFERENCE TO RELATED APPLICATIONS

This application is a divisional of application Ser. No. 15/735,832, now U.S. Pat. No. 11,268,190, filed Dec. 12, 2017, which was a 371 National Entry of International Application No. PCT/US2016/037370, filed Jun. 14, 2016; which claims the priority date of Provisional Application No. 62/181,494, filed Jun. 18, 2015. Each disclosure is hereby incorporated by reference in their entirety.

BACKGROUND OF THE INVENTION

Described herein are halidosilane compounds, processes for making halidosilane compounds, compositions comprising halidosilane compounds, and processes for depositing silicon-containing films (e.g., silicon, amorphous silicon, silicon oxide, silicon nitride, silicon carbide, silicon oxynitride, silicon carbonitride, etc.) using halidosilane compounds.

Silicon-containing films are widely used in semiconductor or electronics applications. For example, thin films of silicon nitride have been widely used in various applications due to their unique physical, chemical and mechanical properties. In semiconductor devices, silicon nitride films are used as gate insulations, diffusion masks sidewall spacers, passivation and encapsulation, etc. Typically, silicon nitride films used in the Front End of Line (FEOL) are currently deposited by low pressure chemical vapor deposition (LPCVD) in a hot wall reactor at one or more temperatures of about 750° C. or less using dichlorosilane and ammonia. As the lateral and vertical dimensions of integrated circuits (IC) continue to shrink, there is an increasing demand for silicon nitride films to be deposited at much lower temperatures (550° C. or less) in order to avoid unwanted reaction between the silicon atom (Si) and metal and realize ultra-high integration devices with precise doping profile control. There is a need for better precursors to meet this demand.

There are many examples for preparing halogen and silane-containing compounds in the art. For example, the reference, "Preparation of disilanyl chloride and disilanyl bromide by the reaction of disilane with hydrogen halide", Abedini, M. et al., J. Inorg. Nucl. Chem. Vol. 25(No. 3), pp. 307-309 (1963), describes a method for preparing disilanyl chloride otherwise known as monochlorodisilane ($H_3SiSiH_2Cl$) and disilanyl bromide otherwise known as monobromodisilane ($H_3SiSiH_2Br$) by reacting $Si_2H_6$ with HCl or HBr, respectively, in the precense of an appropriate aluminum halide catalyst. The reference, "Formation and identification of chlorodisilanes and monochlorotrisilane", Drake, J. E. et al., Inorg. Nucl. Chem. Lett., Vol. 4(7), pp. 385-388 (1968), describes a method for preparing chlorodisilanes and monochlorotrisilanes by condensing $Si_2H_6$ and $BCl_3$, allowing the reaction mixture to warm to 0°, and maintaining the reaction mixture at that temperature for 8 hrs to result in the formation of the following products: $B_2H_6$, $Si_2H_6Cl$, $Si_2H_4Cl_2$, $Si_2H_3Cl_3$, and $Si_2H_2Cl_4$. U.S. Pat. No. 8,206,676 discloses the preparation of monochlorosilane comprising contacting silane and HCl with a catalyst at a time and temperature sufficient to provide the end product.

BRIEF SUMMARY OF THE INVENTION

Described herein are halidosilane compounds, processes for making halidosilane compounds, compositions comprising halidosilane precursor, and processes for depositing silicon-containing films (e.g., silicon, amorphous silicon, silicon oxide, silicon nitride, silicon carbide, silicon oxynitride, silicon carbonitride, metal-doped silicon nitride films, etc.) using halidosilane precursors. Examples of halidosilane precursor compounds described herein, include, but are not limited to, monochlorodisilane (MCDS), monobromodisilane (MBDS), monoiododisilane (MIDS), monochlorotrisilane (MCTS), and monobromotrisilane (MBTS), monoiodotrisilane (MITS). Also described herein are methods for depositing silicon containing films such as, without limitation, silicon nitride, silicon oxynitride, silicon oxide or silicon films, at one or more deposition temperatures of about 500° C. or less.

In one aspect, there is provided a method to deposit a silicon nitride film on at least a portion of a substrate, the method comprising:
  a. providing the substrate within a reactor;
  b. contacting the substrate with a halidosilane precursor selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS), and combinations thereof, to chemically absorb the halidosilane precursor;
  c. purging unreacted halidosilane precursor;
  d. contacting the substrate having absorbed halidosilane precursor with a nitrogen-containing source to form a Si—N—Si linkage;
  e. purging unabsorbed nitrogen-containing source;
wherein the method is a plasma-enhanced deposition process and method steps b. to e. are repeated until a desired thickness of the silicon nitride film is obtained. In certain embodiments, the nitrogen-containing source comprises ammonia plasma, nitrogen/argon plasma, nitrogen/helium plasma, or hydrogen/nitrogen plasma.

In another aspect, there is provided a method to deposit a silicon oxide film on at least a portion of a substrate, the method comprising:
  a. providing the substrate within a reactor;
  b. contacting the substrate with a halidosilane precursor selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS), and combinations thereof, to chemically absorb the halidosilane precursor;
  c. purging unreacted halidosilane precursor;
  d. contacting the substrate having absorbed halidosilane precursor with a oxygen-containing source to form a Si—O—Si linkage;
  e. purging unabsorbed oxygen-containing source;
wherein the method is a plasma-enhanced deposition process and method steps b. to e. are repeated until a desired thickness of the silicon oxide film is obtained. In certain embodiments, the oxygen-containing source comprises ozone, water ($H_2O$) (e.g., deionized water, purifier water, and/or distilled water), oxygen ($O_2$), oxygen plasma, NO, $N_2O$, $NO_2$, carbon monoxide (CO), carbon dioxide ($CO_2$) and combinations thereof.

In a further embodiment, there is provided a method to deposit an amorphous silicon film on at least a portion of a substrate, the method comprising:
  a. providing the substrate within a reactor;
  b. contacting the substrate with a halidosilane precursor selected from the group consisting of monochlorodisilane (MCDS), monobromodisilane (MBDS), monoiododisilane (MIDS), monochlorotrisilane (MOTS), and monobromotrisilane (MBTS), monoiodotrisilane (MITS), and combinations thereof, to chemically absorb the halidosilane precursor;
  c. purging unreacted halidosilane precursor;
  d. contacting the substrate having absorbed halidosilane precursor with a plasma source to form the amorphous silicon film;
  e. purging away reaction by-products;
wherein the method is a plasma-enhanced deposition process and method steps b. to e. are repeated until a desired thickness of the amorphous silicon film is obtained. In certain embodiments, the plasma source comprises a hydrogen plasma, an argon plasma, a helium plasma, a xenon plasma and mixtures thereof.

In certain preferred embodiments, the deposition process to form the silicon-containing film is selected from the group consisting of plasma enhanced atomic layer deposition (PEALD), plasma enhanced chemical vapor deposition (PECVD), and plasma enhanced cyclic chemical vapor deposition (PECCVD). In these embodiments, the plasma used in the deposition process is an in-situ generated plasma, a remotely generated plasma, or a combination thereof.

In another aspect of the invention described herein, there is provided a method to prepare a halidosilane compound selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS), the method comprising: providing a reaction mixture of a polysilane selected from the group consisting of disilane or trisilane and a hydrogen halide selected from the group consisting of hydrogen chloride and hydrogen bromide; and contacting the reaction mixture with a catalyst at a temperature and a time to provide the halidosilane end product wherein the catalyst comprises at least one chosen from a molecular sieve, a silica support comprising $AlCl_3$, an ionic liquid comprising $Al_nCl_{(3n+1)}$ wherein $n \geq 1$ and combinations thereof.

In a further aspect of the invention described herein, there is provided a container comprising a volume of a halidosilane precursor compound, the container having an internal surface modification capable of containing the halidosilane precursor compound in a stable condition,
wherein the internal surface is selected from the group consisting of:
  (a) a surface resulting from mechanical polishing;
  (b) a surface resulting from electropolishing;
  (c) a surface resulting from formation of a hydrophobic protecting layer of organic molecules;
  (d) a surface resulting from providing an internal surface of stainless steel;
  (e) a surface resulting from providing an internal surface of aluminum;
  (f) a surface resulting from providing an internal surface of nickel;
  (g) a surface resulting from a polymer coating;
  (h) a surface having a silicon oxide coating;
  (i) a surface having a crystalline carbon layer molecularly bonded to the metal
  (j) a surface having a passivation layer of a metal fluoride;
  (k) a surface having a passivation layer of silane bonded to metal by exposure to silanes;
  (l) a surface having de-activating hydroxyl groups; and
wherein the volume of the halidosilane precursor compound is selected from the group consisting of monochlorodisilane (MCDS), monobromodisilane (MBDS), monochlorotrisilane (MCTS), monobromotrisilane (MBTS).

BRIEF DESCRIPTION OF SEVERAL VIEWS OF THE DRAWINGS

FIG. 1 provides SEM images of a silicon nitride films deposited using in a PEALD-like process described in Example 3.

DETAILED DESCRIPTION OF THE INVENTION

Described herein are halidosilane compounds, processes for making halidosilane compounds, compositions comprising halidosilane precursors, and processes for depositing silicon-containing films (e.g., silicon, amorphous silicon, silicon oxide, silicon nitride, silicon carbide, silicon oxynitride, silicon carbonitride, doped silicon films, and metal-doped silicon nitride films) using halidosilane precursors. Throughout the description, the term "halido" denotes a compound having a halide atom bonded to a silicon atom, wherein the halide atom is selected from the group consisting of chloride, bromide, and iodide. Examples of halidosilane precursor compounds described herein, include, but are not limited to, monochlorodisilane (MCDS), monobromodisilane (MBDS), monoiododisilane (MIDS), monochlorotrisilane (MCTS), and monobromotrisilane (MBTS), monoiodotrisilane (MITS). Also described herein are methods for depositing silicon containing films such as, without limitation, silicon, amorphous silicon, silicon oxide, silicon nitride, silicon carbide, silicon oxynitride, silicon carbonitride, doped silicon films, and metal-doped silicon nitride films, at one or more deposition temperatures of about 500° C. or less.

While not being bound by theory, it is believed that the halidosilane precursors described herein such as, without limitation, monochlorodisilane (MCDS), monobromodisilane (MBDS), monoiododisilane (MIDS), monochlorotrisilane (MCTS), and monobromotrisilane (MBTS), monoiodotrisilane (MITS), and monobromotrisilane (MBTS), can generate $H_2Si$: di-radicals or $H_3Si$ radical upon heating. It is believed that these radicals promote the formation of anchoring silicon containing fragments, such as $SiH_2$ or $SiH_3$, on the surface of a substrate. In embodiments, wherein the halidosilane precursors are used to deposit a silicon nitride or a metal doped silicon nitride film, those anchored $SiH_2$ or $SiH_3$ fragments can further interact with ammonia plasma or hydrogen/nitrogen plasma to form Si—NH or $SiNH_2$ species on the surface which react with the halido group, or in certain embodiments a metal-containing precursor, to form a Si—N—Si or a Si—N-metal linkage, respectively, resulting in formation of silicon nitride or metal doped silicon nitride.

As previously mentioned, the halidosilane precursor compounds described herein such as, without limitation, monochlorodisilane (MCDS), monobromodisilane (MBDS), monoiododisilane (MIDS), monochlorotrisilane (MCTS), and monobromotrisilane (MBTS), monoiodotrisilane (MITS) are used to deposit a silicon-containing films. Examples of silicon-containing films that can be deposited using the halidosilane precursors include silicon, amorphous silicon, silicon oxide, silicon nitride, silicon carbide, silicon oxynitride, silicon carbonitride, doped silicon films, and metal-doped silicon nitride films.

In one particular embodiment, the halidosilane precursor compounds are used to deposit a high quality silicon nitride film. The term "high quality" means a silicon nitride film that exhibits one or more of the following characteristics: a density of about 2.1 g/cc or greater; a wet etch rate that is less than <2.5 Å/s as measured in a solution of 1:100 dilute HF (dHF) acid; a hydrogen impurity of about 5 e20 at/cc or less as measured by SIMS; and combinations thereof. With regard to the etch rate, a thermally grown silicon oxide film has 0.5 Å/s etch rate in 1:100 dHF.

As previously mentioned, the silicon-containing films are deposited using a deposition process. Deposition processes used with the method described herein include chemical vapor deposition (CVD) or atomic layer deposition (ALD) processed. In certain embodiments of the method described herein, the deposition process is a plasma-based or plasma-enhanced process, such as plasma enhanced atomic layer deposition (PEALD), plasma enhanced chemical vapor deposition (PECVD), and plasma enhanced cyclic chemical vapor deposition (PECCVD). In these or other deposition processes, the plasma is an in-situ generated plasma, a remotely generated plasma, or a combination thereof. In embodiments wherein the deposition process is an ALD process, various commercial ALD reactors such as single wafer, semi-batch, batch furnace or roll to roll reactor can be employed for depositing the silicon-containing film.

In one aspect, there is provided a method to deposit a silicon nitride film on at least a portion of a substrate, the method comprising:
   a. providing the substrate within a reactor;
   b. contacting the substrate with a halidosilane precursor selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS), and combinations thereof, to chemically absorb the halidosilane precursor;
   c. purging unreacted halidosilane precursor;
   d. contacting the substrate having absorbed halidosilane precursor with a nitrogen-containing source to form a Si—N—Si linkage;
   e. purging unabsorbed nitrogen-containing source;
wherein the method is a plasma-enhanced deposition process and method steps b. to e. are repeated until a desired thickness of the silicon nitride film is obtained. In certain embodiments, the nitrogen-containing source comprises ammonia plasma, nitrogen/argon plasma, nitrogen/helium plasma, or hydrogen/nitrogen plasma.

In another aspect, there is provided a method to deposit a silicon oxide film on at least a portion of a substrate, the method comprising:
   a. providing the substrate within a reactor;
   b. contacting the substrate with a halidosilane precursor selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS), and combinations thereof, to chemically absorb the halidosilane precursor;
   c. purging unreacted halidosilane precursor;
   d. contacting the substrate having absorbed halidosilane precursor with a oxygen-containing source to form a Si—O—Si linkage;
   e. purging unabsorbed oxygen-containing source;
wherein the method is a plasma-enhanced deposition process and method steps b. to e. are repeated until a desired thickness of the silicon oxide film is obtained. In certain embodiments, the oxygen-containing source comprises ozone, water ($H_2O$) (e.g., deionized water, purifier water, and/or distilled water), oxygen ($O_2$), oxygen plasma, NO, $N_2O$, $NO_2$, carbon monoxide (CO), carbon dioxide ($CO_2$) and combinations thereof.

In a further embodiment, there is provided a method to deposit an amorphous silicon film on at least a portion of a substrate, the method comprising:
   a. providing the substrate within a reactor;
   b. contacting the substrate with a halidosilane precursor selected from the group consisting of monochlorodisilane (MCDS), monobromodisilane (MBDS), monoiododisilane (MIDS), monochlorotrisilane (MOTS), and monobromotrisilane (MBTS), monoiodotrisilane (MITS), and combinations thereof, to chemically absorb the halidosilane precursor;
   c. purging unreacted halidosilane precursor;
   d. contacting the substrate having absorbed halidosilane precursor with a plasma source to form the amorphous silicon film;
   e. purging away reaction by-products;
wherein the method is a plasma-enhanced deposition process and method steps b. to e. are repeated until a desired thickness of the amorphous silicon film is obtained. In certain embodiments, the plasma source comprises a hydrogen plasma, an argon plasma, a helium plasma, a xenon plasma and mixtures thereof.

In one particular embodiment of the method described herein, the method is used to deposit a metal-doped silicon nitride film on at least a portion of a substrate in a reactor, comprising:
   a. contacting the substrate with a metal-containing precursor to chemically absorb the metal-containing precursors;
   b. purging unreacted metal-containing precursor;
   c. contacting the substrate having absorbed metal-containing precursors with a nitrogen-containing source to form metal-NH or metal-$NH_2$;
   d. purging unabsorbed nitrogen-containing source;
   e. introducing a halidosilane precursor to chemically absorb the silicon-containing precursors;
   f. purging unreacted halidosilane precursor;
   g. contacting the substrate having absorbed halidosilane precursors with a nitrogen-containing source to form Si—N—Si linkage; and
   h. purging unabsorbed nitrogen-containing source;
wherein the deposition process is a plasma-enhanced process and method steps a to h are repeated until a desired thickness of film is reached. The nitrogen-containing source comprises an ammonia plasma, nitrogen/argon plasma, nitrogen/helium plasma, hydrogen/nitrogen plasma and combinations thereof. In some embodiment, steps a to d can be repeated many times before step e to create a nanolaminate structure comprising a metal doped silicon nitride. In this or another embodiment, steps e to h are repeated many times to create nanolaminate structure comprising metal doped silicon nitride. In one particular embodiment, an aluminum-containing precursor such as $AlCl_3$, trimethylaluminum (TMA) or tris(dimethylamino)aluminum (TDMAA) can be employed as a metal-containing precursor which may help deposit conformal silicon nitride films for small feature size of 10 nm or below since $AlCl_3$, TMA or TDMAA is more reactive towards NH or $NH_2$ on the surface and may also catalyze reaction between Si—H and NH or $NH_2$ on the surface to provide conformal deposition of the top, sidewall as bottom of a trench or via in a semi-fabricated semi-conductor substrate. In another embodiment, a boron-containing precursor such as $BCl_3$, trimethylborane (TMB), triethylborane (TEB), or tris(dimethylamino)borane (TDMAB), can be employed as metal-containing precursor which may help deposit conformal silicon nitride films for small feature size of 10 nm or below since $BCl_3$, TMB, TEB, or TDMAB is more reactive towards NH or $NH_2$ on the surface and may also catalyze reaction between Si—H and NH or $NH_2$ on the surface to provide conformal deposition of the top, sidewall as bottom of a trench or via in a semi-fabricated semi-conductor substrate.

Yet another embodiment, the method is a process to deposit a high quality metal doped silicon nitride on a substrate in a reactor, comprising:
 a. contacting the substrate with a metal-containing precursor to chemically absorb the metal-containing precursors;
 b. purging unreacted metal-containing precursor;
 c. contacting the substrate having chemically absorbed metal-containing precursor with a halidosilane precursor to chemically absorb the halidosilane precursors;
 d. purging unreacted halidosilane precursor;
 e. contacting the substrate having absorbed metal-containing precursors and absorbed halidosilane precursors with a nitrogen-containing source to form Si—N—Si as well as metal-N—Si linkage;
 f. purging unabsorbed nitrogen-containing source;
wherein the process is a plasma-enhanced process and step a to f are repeated until a desired thickness of film is reached. In some embodiments, the halidosilane precursor can be introduced before the metal-containing precursor. The nitrogen-containing source comprises an ammonia plasma, nitrogen/argon plasma, nitrogen/helium plasma or hydrogen/nitrogen plasma and their combinations thereof In embodiments wherein the silicon-containing film is metal-doped, the metal-containing precursors comprise a metal compound selected from the group consisting of a metal alkyl, a metal carbonyl, a metal amide, and other volatile metal-containing compounds that can used in the deposition processed described herein. Exemplary metal-containing compounds include, but are not limited to, metal alkyls such as diethyl zinc, trimethylaluminum (TMA), triethylaluminum (TEA), metalloid alkyl such as trimethylborane (TMB), triethylborane (TEB), (2,4-dimethylpentadienyl)(ethylcyclopentadienyl) ruthenium, bis(2,4-dimethylpentadienyl) ruthenium, 2,4-dimethylpentadienyl) (methylcyclopentadienyl) ruthenium, bis (ethylcyclopentadienyl) ruthenium; metal carbonyl such as dicobalt hexacarbonyl t-butylacetylene (CCTBA) or cyclopentadienyl cobalt dicarbonyl (CpCo(CO)2), Ru3(CO)12; metal amides such as tris(dimethylamino)aluminum (TDMAA), tris(diethylamino)aluminum (TDEAA), tetrakis(dimethylamino) zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri (dimethylamino)tantalum (TAIMAT), tert-amylimino tri (diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten; metal halides such as titanium chloride, aluminum chloride ($AlCl_3$), boron chloride ($BCl_3$), hafnium tetrachloride, tantalum pentachloride, tungsten hexachloride, metalloid chloride such as boron chloride ($BCl_3$), gallium chloride, and metalloid amides such as tris(dimethylamino)borane (TDMAB), tris(diethylamino)borane (TDEAB).

Throughout the description, the term "alkyl" denotes a linear, or branched functional group having from 1 to 10 or 1 to 6 carbon atoms. Exemplary alkyl groups include, but are not limited to, methyl, ethyl, propyl, isopropyl, butyl, isobutyl, sec-butyl, tert-butyl, pentyl, iso-pentyl, tert-pentyl, hexyl, iso-hexyl, and neo-hexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. For example, metal alkyl is metal-containing compounds having at lease one metal-carbon bond such as trimethylaluminum, tri-n-propylaluminum, tri-iso-propylaluminum, tri-sec-butylaluminum, tri-iso-butylaluminum; metalloid alkyl such as trimethylborane (TMB), triethylborane (TEB).

In the deposition methods described herein, the deposition temperature uses one or more of the following temperatures as endpoints: 100, 125, 150, 175, 200, 225, 250, 275, 300, 325, 350, 375, 400, 425, 450, and 500° C. Exemplary deposition temperature ranges include, but are not limited to the following: from about 100° C. to about 500° C.; or from about 200° C. to about 350° C.

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited silicon-containing films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

In certain embodiments, the resultant silicon-containing films or coatings can be exposed to a post-deposition treatment such as, but not limited to, a plasma treatment, chemical treatment, ultraviolet light exposure, electron beam exposure, and/or other treatments to affect one or more properties of the film.

In some particular embodiments, the silicon-containing films are silicon nitride or metal doped silicon nitride films. In there embodiments, the films have a dielectric constant of 6 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film.

In another embodiment, there is provided a vessel for depositing a silicon-containing comprising a halidosilane precursor selected from the group consisting of monochlorodisilane (MCDS), monobromodisilane (MBDS), monoiododisilane (MIDS), monochlorotrisilane (MCTS), and monobromotrisilane (MBTS), monoiodotrisilane (MITS). In one particular embodiment, the vessel comprises at least one pressurizable vessel (preferably of stainless steel) fitted with the proper valves and fittings to allow the delivery of one or more precursors to the reactor for a CVD or an ALD process. In this or other embodiments, the halidosilane precursors is provided in a pressurizable vessel comprised of stainless steel and the purity of the precursor is 98% by weight or greater or 99.5% or greater which is suitable for the majority of semiconductor applications. In certain embodiments, such vessels can also have means for mixing the precursors with one or more additional precursor if desired. In these or other embodiments, the contents of the vessel(s) can be premixed with an additional precursor. In other embodiments, the vessel having an internal surface modification capable of containing the silicon containing in a stable condition to avoid any potential decomposition during storage or use where the internal surface is selected from the group consisting of;
  (a) a surface resulting from mechanical polishing;
  (b) a surface resulting from electropolishing;
  (c) a surface resulting from formation of a hydrophobic protecting layer of organic molecules;
  (d) a surface resulting from providing an internal surface of stainless steel;
  (e) a surface resulting from providing an internal surface of aluminum;
  (f) a surface resulting from providing an internal surface of nickel;
  (g) a surface resulting from a polymer coating;
  (h) a surface having a silicon oxide coating;
  (i) a surface having a crystalline carbon layer molecularly bonded to the metal
  (j) a surface having a passivation layer of a metal fluoride;
  (k) a surface having a passivation layer of silane bonded to metal by exposure to silanes;
  (l) a surface having de-activating hydroxyl groups.

In yet another aspect of the invention described therein, there is provided a process for preparing the halidosilane precursors having the formula $Si_2H_5Cl$ (monochlorodisilane) or $Si_3H_7Cl$ (monochlorotrisilane) from a reaction mixture comprising disilane ($Si_2H_6$) or trisilane ($Si_3H_8$) and hydrogen chloride (HCl), in the presence of one or more catalysts are described herein. In embodiments where disilane is employed as the starting material, due to the possibility of multiple chlorination of one silicon atom of disilane or single chlorination of both silicon atoms of disilane, structural isomers of dichlorodisilane exist in the 1,1-dichloro- and 1,2 dichloro-forms. In one such embodiment, there is provided a method for preparing an end product comprising at least one chosen from monochlorodisilane, 1,1-dichlorodisilane, 1,2-dichlorodisilane and combinations thereof comprising: providing a reaction mixture of disilane and a hydrogen chloride; and contacting the reaction mixture with a catalyst at a temperature and at a time to provide the end product wherein the catalyst comprises at least one chosen from a zeolite, molecular sieve, and metal chloride supported on an inert support.

The processes described herein overcome the absence of scalable methods for selectively preparing chlorinated disilanes such as monochlorodisilane, 1,1-dichlorodisilane, 1,2-dichlorodisilane, or combinations of monochlorodisilane and dichlorodisilanes in yields of 20 mol % or greater or, more preferably, 50 mol % or greater (based on disilane usage) by reaction of disilane and hydrogen chloride over a selected catalyst. In one embodiment, the catalyst is comprised of a molecular sieve or zeolite. Catalyst selection, catalyst contact time, temperature, pressure, and combinations thereof are used in the method described herein to selectively form one chlorodisilane over another, and to favorably adapt the byproduct concentrations to downstream processing operations (i.e. purification). The process described herein therefore allows for the direct syntheses of monochlorodisilane, dichlorodisilanes, or combinations thereof from commodity chemicals and inexpensive catalysts at scales appropriate to the industry without the complexity (e.g. significant safety issues with direct reaction of disilane with elemental chlorine) and disadvantages (e.g. high cost of silver chloride) presented by the methods described in the prior art for the preparation of chlorinated disilanes.

In one embodiment, the end-products monochlorodisilane or dichlorodisilanes can be produced through the contact of a reaction mixture comprising disilane and anhydrous hydrogen chloride with an acidic zeolite catalyst according to Equations 1 and 2.

$$Si_2H_6 + HCl \rightarrow Si_2H_5Cl + H_2 \quad \text{(Equation 1)}$$

$$Si_2H_6 + 2HCl \rightarrow Si_2H_4Cl_2 + 2H_2 \quad \text{(Equation 2)}$$

In this or other embodiments, the process described herein can be run continuously with high selectivity and yield by optimizing the contact time between the reactant gas mixture and the catalyst in a flow system to maximize precursor consumption while minimizing byproduct formation. The end product composition and yield can be optimized by varying one or more of the following conditions: HCl/disilane feed ratio, gas-catalyst contact (residence time), catalyst composition (including size, porosity, support, and pretreatment procedure), temperature, and pressure.

In one embodiment, the reaction is performed in a packed bed reactor or a series of packed bed reactors and the catalyst is a solid acid. In one particular embodiment, the solid acid catalyst may be comprised of a zeolite or molecular sieve. Examples of suitable zeolitic catalysts include, but are not limited to structured zeolites, such as Y-type (FAU), mordenite (MOR), ZSM-5 (MFI), ZSM-11 (MEL), ZSM-12 (MTW), MCM-22 (MWW), etc. having defined Si/Al ratio (e.g. non-amorphous alumino-silicates) and combinations thereof.

The cation associated with the zeolites include, but are not limited to, protons, alkali metal cations, alkaline metal cations, trivalent metal cations and complex cations (e.g. ammonium). Enhancement of the catalyst performance, in terms of activity, selectivity and/or longevity, may also be made in certain embodiments by the incorporation of one or more additional catalytic metals in the catalyst. In these or other embodiments, the inclusion of metals such as, but not limited to, platinum, palladium, silver, or iron, may be used.

In this embodiment or other embodiments of the method for preparing the halidosilane precursors, the synthesis reaction occurs at one or more temperatures ranging from about 20° C. to about 200° C. Examples of particular reactor temperature for the synthesis ranges include but are not limited to, 20° C. to 200° C. or from 80° C. to 140° C.

In certain embodiments of the synthesis method described herein, the pressure of the reaction may range from about 0.1 to about 115 psia (1 to 800 kPa) or from 10 to 45 psia (70 to 310 kPa). In one particular embodiment, the reaction is run at a pressure ranging from 14 to 15 psia.

In certain preferred embodiments of the synthesis method, the reagents in the reaction mixture are gaseous. In these embodiments, the contact time of the catalyst with reaction mixture may be modulated by reactant (e.g. disilane and HCl) gas flow rate. The gas-catalyst contact time may range from about 5 to about 200 seconds. Exemplary times for the contact of the reactive mixture with the catalyst include ranges having any one or more of the following endpoints: 5, 10, 20, 30, 40, 50, 60, 70, 80, 90, 100, 110, 120, 130, 140, 150, 160, 170, 180, 190, or 200 seconds. Examples of particular contact time ranges include but are not limited to, 20 to 100 or from 10 to 40 seconds.

The HCl/disilane feed ratio within the reaction mixture may be selected from a range of 0.5 to 3.5, preferably 0.5 to 2.0, with lower values generally favoring monochlorodisilane product and higher values favoring more highly chlorinated disilanes including, but not limited to, 1,1-dichlorodisilane and 1,2-dichlorodisilanes.

In certain embodiments, the catalyst porosity is chosen to favor one chlorosilane product over other possible chlorosilane products. For example, a porous zeolite with smaller pore size will yield monochlorodisilane over more highly chlorinated disilanes. In another embodiment, acidic zeolites with varying levels of acidity favor production of one chlorosilane product over other possible chlorosilane products.

In one preferred embodiment, the chlorinated disilane products are captured in a condenser at one temperature while unreacted disilane is captured at a second, lower temperature. The captured disilane is them recycled to the process as raw material for production of chlorodisilanes. The temperature of the chlorodisilane condenser ranges from about 0° C. to about −50° C. In one particular embodiment, the temperature of the chlorodisilane condenser is −30° C. The temperature of the disilane condenser ranges from about −50° C. to about −120° C. In one particular embodiment, the temperature of the disilane condenser is −80° C.

In one particular embodiment, the end product halidosilane compounds are substantially free halide ions, such as without limitation, chlorides, bromides, iodides or hydrogen halides (e.g., HCl or HBr). The term "substantially free" means that the end product halidosilane compounds comprises 2 weight percent or less, 1 weight percent or less, 0.5 weight percent or less, 0.1 weight percent or less, 500 parts per million (ppm) or less, 100 ppm or less, 50 ppm or less, 10 ppm or less, and 5 ppm or less of one or more halide ion or hydrogen halides. Certain halide ions, such as chlorides, are known to act as decomposition catalysts for halidosilane compounds as well as potential contaminate to detrimental to performance of electronic device. The gradual degradation of the halidosilane compounds may directly impact the film deposition process making it difficult for the semiconductor manufacturer to meet film specifications. In addition, the shelf-life or stability is negatively impacted by the higher degradation rate of the halidosilane compounds thereby making it difficult to guarantee a 1-2 year shelf-life. Therefore, the accelerated decomposition of the halidosilane compounds presents safety and performance concerns related to the formation of these flammable and/or pyrophoric gaseous byproducts such as silane.

Compositions according to the present invention that are substantially free of halides can be achieved by implementing an effective purification process to remove halides, such as without limitation chlorides, from the crude product such that the final purified product is substantially free of halides or hydrogen chlorides. The crude product may also be treated by various purification methods to render the final product substantially free of halides such as chlorides. Such methods are well described in the prior art and, may include, but are not limited to, purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as hydrogen chloride (HCl) which can be used as starting material or generated as by-product.

In one embodiment wherein the halidosilane compounds are synthesized using HCl as a reagent, the chlorinated disilane products are purified by passing a stream of inert gas through a vessel of the chlorinated disilane products at a temperature where the chlorinated disilane products are in the liquid phase. Suitable inert gases include, but are not limited to, helium, argon, and nitrogen. The temperature of the chlorinated disilane products in the vessel ranges from about 0° C. to about −80° C. In one particular embodiment, the temperature of the chlorinated disilane products is −30° C. In another embodiment, the resulting inert gas stream containing chlorinated disilane impurities may be captured in a condenser and recycled to the process as raw material for production of chlorodisilanes.

In this or other embodiments, the chlorinated disilane products are purified by fractional distillation. The fractional distillation may be conducted under conditions of temperature and pressure wherein the chlorinated disilanes are separated to yield purified products such as monochlorodisilane. In one embodiment, the fractional distillation is conducted after initial purification by passing a stream of inert gas through a vessel of the chlorinated disilane products. In a separate embodiment, the fractional distillation is conducted without any other purification of the chlorinated disilanes. The temperature of the chlorinated disilanes during the fractional distillation ranges from about −30° C. to about 120° C. Examples of suitable temperatures for fractional distillation are 0° C. and 25° C. The pressure of the distillation system during the fractional distillation ranges from about 0 torr to about 800 torr. Examples of suitable pressures for fractional distillation are 2 torr and 50 torr.

EXAMPLES

Example 1: Continuous Synthesis of Monochlorodisilane by Reaction of HCl with Disilane in a Zeolite H-ZSM-5/Stainless Steel Packed Tubular Reactor A tubular reactor with 1" inner diameter was packed with a 12" bed of pelletized Zeolite H-ZSM-5 (acid form of Zeolite ZSM-5; ZeoCat PZ-2/25 H). The catalyst bed was packed in four zones with decreasing concentration of stainless steel shot (2 mm diameter). The stainless steel shot/catalyst ratio in the three zones from the front end of the catalyst bed was 3:1, 2:1, 1:1. The fourth zone was packed with undiluted catalyst. The catalyst was heated to 250° C. under nitrogen flow for 8 hours to dehydrate the catalyst. Disilane (50 sccm) and helium (50 sccm) flow was initiated before addition of HCl to the reactor. The data from a series of experiments are summarized in Table 1. The pressure in the reactor was approximately 1 atmosphere in all experiments. The temperature in the second column corresponds to the external skin temperature of the reactor in ° C. The data in the columns labeled Zones 1-3 are temperatures in ° C. measured in the catalyst bed in three locations with Zone 1 at the front end of the catalyst bed, Zone 2 in the center of the catalyst bed, and Zone 3 at the end of the catalyst bed. Gas flows are measured in standard cubic centimeters per minute (sccm).

The reported conversion is the percentage of disilane that is converted to monochlorodisilane or more highly chlorinated disilanes. Selectivity is defined as the percent of chlorinated disilanes that comprises monochlorodisilane. The calculated yield is the conversion multiplied by the selectivity.

of residence time. Experiments 4 and 5 demonstrate that employing a higher HCl/disilane ratio increases conversion but lowers selectivity, giving same effective monochlorodisilane yield as a lower HCl/disilane ratios. The data generated in experiments 6-9 show the effect of catalyst bed temperature on the conversion of disilane. Through experiments 6-9, a small decrease in catalyst bed temperature results in lower conversion while maintaining essentially constant selectivity resulting in lower yields at lower bed temperatures.

Example 2: Continuous Synthesis of Monochlorodisilane by Reaction of HCl with Disilane in a Zeolite HY Packed Tubular Reactor A tubular reactor with 1" inner diameter was packed with a 12" bed of Zeolite HY (acid form of Zeolite Y). The catalyst was heated to 250° C. under nitrogen flow for 8 hours to dehydrate the catalyst. Disilane flow (50 sccm) and helium flow (50 sccm) was initiated before addition of HCl to the reactor. The data from a series of experiments are summarized in Table 2. The pressure in the reactor was approximately 1 atmosphere in all experiments. The temperature in the second column corresponds to the external

TABLE 1

Continuous Synthesis of Monochlorodisilane by Reaction of HCl with Disilane in a Zeolite H-ZSM-5/Stainless steel Packed Tubular Reactor.

| Experiment | Temp. | HCl flow | $Si_2H_6$ flow | He flow | Zone 1 | Zone 2 | Zone 3 | Conversion (%) | MCDS Yield (%) | Selectivity (%) |
|---|---|---|---|---|---|---|---|---|---|---|
| 1 | 100 | 75 | 75 | 100 | 103 | 105 | 95 | 72.2 | 57.5 | 79.6 |
| 2 | 100 | 75 | 75 | 50 | 112 | 112 | 97 | 70.9 | 56.8 | 80.1 |
| 3 | 100 | 100 | 75 | 50 | 114 | 115 | 98 | 81.3 | 60.2 | 74.1 |
| 4 | 100 | 125 | 75 | 50 | | | | 85.7 | 57.7 | 67.3 |
| 5 | 100 | 125 | 75 | 0 | 116 | 116 | 100 | 82.8 | 58.2 | 70.2 |
| 6 | 100 | 75 | 75 | 0 | 113 | 112 | 85 | 61.7 | 45.8 | 74.2 |
| 7 | 100 | 100 | 100 | 0 | 117 | 113 | 81 | 61.9 | 50.3 | 81.2 |
| 8 | 100 | 125 | 125 | 0 | 123 | 116 | 80 | 60.8 | 50.1 | 82.4 |
| 9 | 100 | 150 | 150 | 0 | 119 | 113 | 77 | 58.9 | 48.5 | 82.4 |
| 10 | 100 | 75 | 100 | 50 | 102 | 115 | 105 | 79.2 | 60.9 | 76.9 |
| 11 | 100 | 75 | 100 | 50 | 102 | 116 | 105 | 78.9 | 58.7 | 74.3 |
| 12 | 100 | 75 | 100 | 50 | 100 | 116 | 103 | 78.0 | 57.8 | 74.2 |
| 13 | 100 | 75 | 100 | 50 | 98 | 115 | 104 | 77.8 | 57.4 | 73.7 |
| 14 | 100 | 75 | 100 | 50 | 97 | 115 | 101 | 76.7 | 56.9 | 74.1 |
| 15 | 100 | 75 | 100 | 50 | 97 | 114 | 101 | 74.7 | 55.5 | 74.3 |

The data in Table 1 demonstrate the effect of catalyst contact time (residence time), hydrogen chloride/disilane ratio, and temperature on MCDS yield using the H-ZSM-5 catalyst. Experiments 1 and 2 suggest that small changes in the helium dilution flow have a small effect on the MCDS yield. However, experiments 6-9 show that variation of residence time based on the total HCl/disilane flow in the absence of helium does affect both conversion and selectivity. The variation in conversion and selectivity counteract each other as lowering residence time (increasing flow) improves disilane selectivity (increasing from 74.2% to 82.4%) but lowers conversion (decreasing from 61.7% to 58.9%) resulting in moderate changes in yield as a function skin temperature of the reactor in ° C. The data in the columns labeled Zones 1-3 are temperatures in ° C. measured in the catalyst bed in three locations with Zone 1 at the front end of the catalyst bed, Zone 2 in the center of the catalyst bed, and Zone 3 at the end of the catalyst bed. Gas flows of disilane and HCl were varied from 25 sccm to 150 sccm. Helium flows were varied from 0 sccm to 100 sccm in various experiments. The reported conversion is the percentage of disilane that is converted to monochlorodisilane or more highly chlorinated disilanes. Selectivity is defined as the percent of chlorinated disilanes that comprises monochlorodisilane. The calculated yield is the conversion multiplied by the selectivity.

TABLE 2

Continuous Synthesis of Monochlorodisilane by Reaction of HCl with Disilane in a Zeolite HY Packed Tubular Reactor

| Experiment | Reaction temp. | Zone 1 | Zone 2 | Zone 3 | Conversion (%) | MCDS Yield (%) | Selectivity (%) |
|---|---|---|---|---|---|---|---|
| 1 | 100 | 95  | 105 | 96  | 31.4 | 28.4 | 90.5 |
| 2 | 100 | 97  | 105 | 96  | 34.5 | 31.8 | 92.2 |
| 3 | 100 | 95  | 104 | 95  | 28.2 | 25.6 | 90.9 |
| 4 | 115 | 106 | 119 | 109 | 31.4 | 28.1 | 89.5 |
| 5 | 115 | 106 | 118 | 108 | 30.3 | 27.3 | 90.2 |

The data in experiments 1-5 of Example 2 show that Zeolite HY has a much higher selectivity compared to H-ZSM-5 for the production of monochlorodisilane vs. more highly chlorinated disilanes. However, the conversion under similar reaction conditions is lower for Zeolite HY as compared to H-ZSM-5. Increasing the bed temperature by approximately 10-15° C. (experiments 4 and 5) has a negligible impact on the MODS yield.

Example 3: Deposition of Silicon and Nitrogen Containing Films Using Monochlorodisilane (MCDS) and Ammonia ($NH_3$) Plasma All experiments were conducted with an Applied Materials Precision 5000 system in a 200 mm DXL chamber in cyclic fashion to simulate an ALD processes. The PECVD chamber was equipped with direct liquid injection (DLI) delivery capability and vapor draw delivery systems. In the following examples, the chemicals were delivered by the vapor draw system with the temperature dependent on the precursors' boiling points. The deposition conditions were as follows: typical precursor vapor flow rates ranged from about 10 to about 100 standard cubic centimeters (sccm); plasma power density ranged from about 0.75 to about 3.5 Watts/centimeter squared ($W/cm^2$); and pressure ranged from about 0.75 to about 15 Torr. Thickness and refractive index (RI) at 632 nm were measured by a reflectometer (SCI-2000) and an ellipsometer (J. A. Woollam M2000UI). Typical film thickness ranged from 10 to 200 nm. Bonding properties hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. Mercury probe was adopted for the electrical properties including dielectric constant, leakage current and breakdown field. Wet etch rate (WER) was measured in 1:100 dilute HF.

A plasma enhanced atomic layer deposition (PEALD)-like process was conducted on the P-5000 DXL chamber. In this experiment, MCDS was flowed at the rate of 20 sccm and followed by a soaking step and multiple purging/pumping steps. Then, a 600 W plasma was stricken with 100 sccm He and 100 sccm $NH_3$ flow for 20 seconds. The process was repeated for up to 330 cycles. The process wafer temperature was 300° C.

The film thickness was about 87 nm, indicating the deposition rate was 2.6 Angstroms/cycle (Å/cycle). The refractive index was 1.83, indicating the film was a high quality silicon nitride film. In the FT-IR spectrum, the Si—N peak was sharp and narrow at around 850 $cm^{-1}$. The film density was about 2.45 grams/cubic centimeter ($g/cm^3$).

The leakage current and breakdown field were measured to evaluate the film properties. The leakage current was 1E-8 $A/cm^2$ at 2 MV/cm and 1E-6 $A/cm^2$ at 4 MV/cm. The breakdown field was greater than 8 MV/cm.

The PEALD film was also deposited onto pattern wafers having features with a width of 250 nanometers (nm) and aspect ratio of 20:1. FIG. 1 provides a Scanning Electron Microscopy (SEM) of the silicon nitride film deposited using the method described in Example 3 that shows that the conformality of the film was greater than 70% and close to 100% at the bottom of the features.

The invention claimed is:

1. A method for forming a silicon nitride film on at least one surface of a substrate by an atomic layer deposition process, the method comprising:
   providing the at least one surface of the substrate in a reactor;
   introducing into the reactor at least one halidosilane precursor from the group consisting of monochlorodisilane (MCDS), monobromodisilane (MBDS), monoiododisilane (MIDS), monochlorotrisilane (MCTS), monobromotrisilane (MBTS), and monoiodotrisilane (MITS), wherein the at least one halidosilane precursor is the only silicon-containing precursor introduced into the reactor, and
   introducing a nitrogen-containing source into the reactor to form the silicon nitride film on the at least one surface.

2. The method of claim 1 wherein the nitrogen-containing source is selected from the group consisting of ammonia, hydrazine, monoalkylhydrazine, dialkylhydrazine, organoamine, organodiamine, ammonia plasma, hydrazine plasma, nitrogen plasma, nitrogen/hydrogen plasma, organoamine plasma, organodiamine plasma and mixtures thereof.

3. The method of claim 2 wherein the plasma is generated in situ.

4. The method of claim 2 wherein the plasma is generated remotely.

5. The method of claim 1 wherein the silicon nitride film is selected from the group consisting of an amorphous film, a boron doped film, and a germanium doped film.

* * * * *